(12) United States Patent
Jang et al.

(10) Patent No.: US 10,700,198 B2
(45) Date of Patent: Jun. 30, 2020

(54) SEMICONDUCTOR DEVICE HAVING LOW $R_{dson}$ AND MANUFACTURING METHOD THEREOF

(71) Applicant: Magnachip Semiconductor, Ltd., Cheongju-si (KR)

(72) Inventors: Jae Hyung Jang, Daejeon (KR); Jin Yeong Son, Cheongju-si (KR); Hee Hwan Ji, Daejeon (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/938,284

(22) Filed: Mar. 28, 2018

(65) Prior Publication Data
US 2019/0043986 A1  Feb. 7, 2019

(30) Foreign Application Priority Data
Aug. 2, 2017  (KR) .......... 10-2017-0098143

(51) Int. Cl.
| | |
|---|---|
| *H01L 29/78* | (2006.01) |
| *H01L 27/092* | (2006.01) |
| *H01L 29/66* | (2006.01) |
| *H01L 29/423* | (2006.01) |
| *H01L 29/10* | (2006.01) |
| *H01L 27/06* | (2006.01) |
| *H01L 29/06* | (2006.01) |

(52) U.S. Cl.
CPC ...... *H01L 29/7835* (2013.01); *H01L 27/0617* (2013.01); *H01L 27/0927* (2013.01); *H01L 27/0928* (2013.01); *H01L 29/0692* (2013.01); *H01L 29/1041* (2013.01); *H01L 29/1045* (2013.01); *H01L 29/42372* (2013.01); *H01L 29/66659* (2013.01); *H01L 29/0653* (2013.01); *H01L 29/665* (2013.01)

(58) Field of Classification Search
CPC ............ H01L 27/0927; H01L 29/7835; H01L 29/66659
USPC ................................................ 257/335, 336
See application file for complete search history.

(56) References Cited

U.S. PATENT DOCUMENTS

| | | | | |
|---|---|---|---|---|
| 7,821,082 B1 * | 10/2010 | Lin | ..................... | H01L 29/7835 257/409 |
| 2010/0052057 A1 * | 3/2010 | Chung | .............. | H01L 29/66659 257/362 |
| 2010/0244128 A1 * | 9/2010 | Bulucea | .............. | H01L 29/1045 257/335 |
| 2011/0156142 A1 * | 6/2011 | Teo | ..................... | H01L 29/0646 257/336 |

(Continued)

*Primary Examiner* — David Vu
*Assistant Examiner* — Brandon C Fox
(74) *Attorney, Agent, or Firm* — NSIP Law

(57) ABSTRACT

A semiconductor device includes a substrate, a first P-type well region and a second P-type well region disposed in the substrate, wherein the first P-type well region and the second P-type well region are spaced apart from each other, an N-type source region disposed in the substrate, wherein the N-type source region is disposed spaced apart from the second P-type well region, an N-type drain region disposed in the second P-type well region, an N-type LDD region disposed near the N-type drain region, and a gate insulating layer and a gate electrode on the substrate, wherein the gate electrode partially overlaps the second P-type well region.

20 Claims, 10 Drawing Sheets

(56) References Cited

U.S. PATENT DOCUMENTS

2012/0061761 A1* 3/2012 Makiyama .......... H01L 27/0266
257/355
2015/0001636 A1 1/2015 Cheng et al.

* cited by examiner

SEMICONDUCTOR DEVICE HAVING LOW $R_{dson}$ AND MANUFACTURING METHOD THEREOF

CROSS-REFERENCE TO RELATED APPLICATIONS

This application claims the benefit under 35 USC 119(a) of Korean Patent Application No. 10-2017-0098143 filed on Aug. 2, 2017 in the Korean Intellectual Property Office, the entire disclosure of which is incorporated herein by reference for all purposes.

BACKGROUND

1. Field

The following description relates to a semiconductor device having a low $R_{dson}$ and a manufacturing method of such a semiconductor device. The following description also relates to a semiconductor device having an asymmetric Lightly Doped Drain (LDD) and an asymmetric well region and a manufacturing method of such a semiconductor device.

2. Description of Related Art

A semiconductor device requires a smaller chip size as well as a smaller transistor included in a circuit to improve its characteristics. Accordingly, the semiconductor devices are more competitive products if they have a relatively small size but maintain or improve performance.

Therefore, an asymmetric or hybrid device is being developed. A hybrid semiconductor device of related technologies has different LDD depths with respect to a first source drain and a second source drain. For example, an LDD process having a shallow depth is applied to a first source drain, and an LDD process having a deep depth is applied to a second source drain.

However, in order to manufacture a hybrid device having such various depths, many masks are used, which leads to an increase in a cost for performing the masks and a time for manufacturing a semiconductor device, that is, Turn Around Time (TAT). Also, it is difficult to achieve a desired $R_{dson}$, on-state resistance between source and drain for such a semiconductor device. $R_{dson}$ is the basis for the maximum current ratio of the semiconductor device, and also affects current loss. Accordingly, a lower $R_{dson}$ leads to better semiconductor device performance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a substrate, a first P-type well region and a second P-type well region disposed in the substrate, wherein the first P-type well region and the second P-type well region are spaced apart from each other, an N-type source region disposed in the substrate, wherein the N-type source region is disposed spaced apart from the second P-type well region, an N-type drain region disposed in the second P-type well region, an N-type LDD region disposed near the N-type drain region, and a gate insulating layer and a gate electrode disposed on the substrate, wherein the gate electrode partially overlaps the second P-type well region.

The semiconductor device may further include an isolation region disposed between the first P-type well region and the N-type source region, wherein the first P-type well region is in contact with the isolation region.

The second P-type well region may extend laterally toward the N-type source region from the N-type drain region, and may be disposed above at least half of a length of the gate electrode.

The second P-type well region may be disposed to overlap from 50 to 90% of an entire length of the gate electrode.

No LDD region may be disposed near the N-type source region.

A silicide blocking insulating layer may be disposed to extend continuously from a portion of the gate electrode to a portion of the substrate disposed between the gate electrode and the N-type drain region.

The N-type drain region may be disposed to be spaced apart from the gate electrode.

The first P-type well region may vertically overlap the source region.

A halo region may be disposed near the N-type drain region.

The semiconductor device may further include a first P-type bulk region may be disposed in the first P-type well region, and a second P-type bulk region may be disposed in the second P-type well region.

The first P-type bulk region may be in contact with the N-type source region.

The semiconductor device may further include any one or any combination of any two or more of a well contact plug in contact with the first P-type bulk region, a source contact plug in contact with the N-type source region, a drain contact plug in contact with the N-type drain region, and a gate contact plug in contact with the gate electrode.

The semiconductor device may further include a first trench isolation in contact with the N-type source region and a second trench isolation in contact with the N-type drain region.

The N-type drain region may have an area that is the same as or similar to the area of the N-type source region.

In another general aspect, a semiconductor device includes a substrate, a P-type well region and an N-type well region disposed in the substrate, an N-type drain region disposed in the P-type well region, an N-type source region disposed in the N-type well region, a P-type LDD region disposed in the N-type well region, and a gate insulating layer and a gate electrode disposed on the substrate, wherein the gate electrode partially overlaps the P-type well region and the N-type well region.

The semiconductor device may further include an N-type LDD region disposed in the P-type well region.

In another general aspect, a semiconductor device includes a substrate, a first well region and a second well region disposed in the substrate, wherein the first well region and the second well region are spaced apart from each other, a source region disposed in the substrate, wherein the source region is disposed spaced apart from the second well region, a drain region disposed in the second well region, an LDD region disposed near the drain region, and a gate insulating layer and a gate electrode disposed on the substrate, wherein the gate electrode partially overlaps the second well region.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
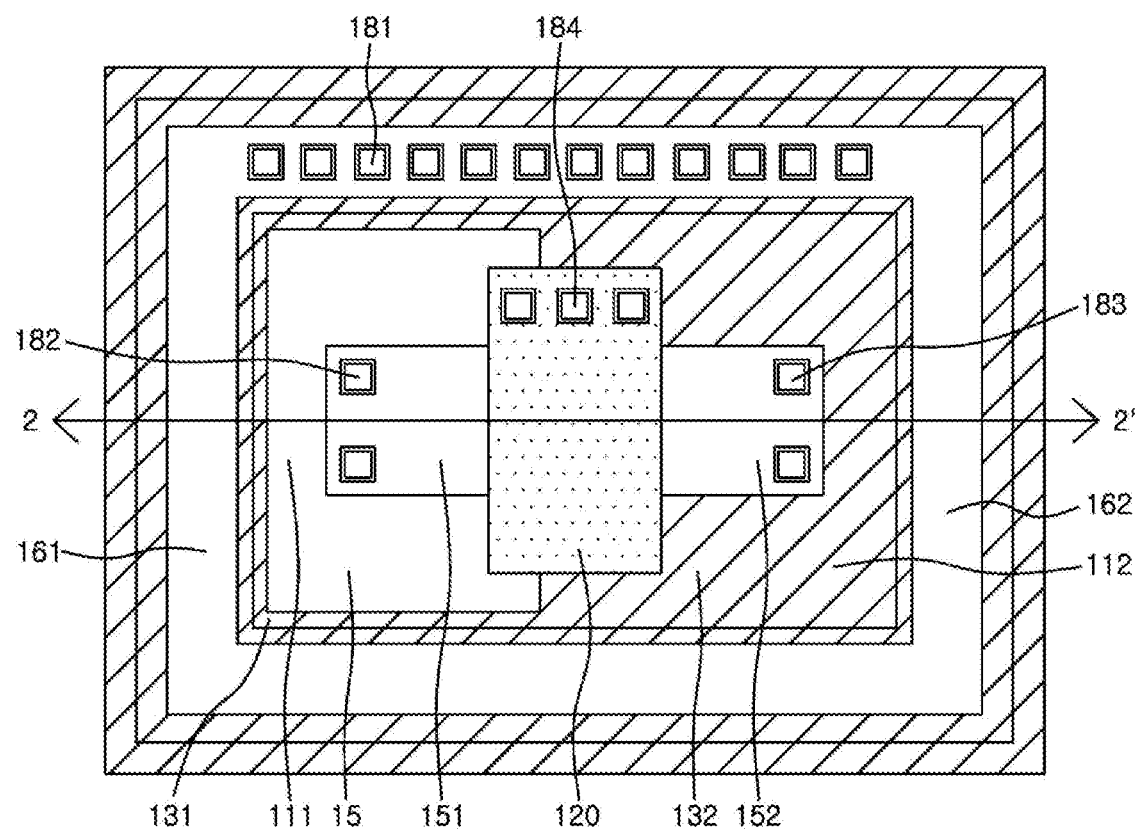
FIG. 1 is a drawing illustrating an example of a top view of an NMOS semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Throughout the specification, the term "near" is intended to mean that a given element that is "near" another element is in direct contact with the other element it is "near" to, or it is not necessarily in direct contact with the element it is "near" to, but is nonetheless in close proximity to the element it is "near" to, even if one or more intervening elements separate the elements that are "near" to one another.

The examples provide a semiconductor device that uses an asymmetric LDD structure and a well structure to improve the performance of an on-state resistance between source and drain ($R_{dson}$) of the semiconductor device.

In addition, the examples provide a method for manufacturing a semiconductor device at a relatively low cost by forming a well region and an LDD region based on the same asymmetric mask pattern after a gate manufacturing process. Such a method is able to reduce the number of masks used in the semiconductor device.

The examples provide for the structure of a semiconductor device that involves adjusting a well region or a source-drain region to reduce an effective channel length and thereby decrease a threshold voltage and also to improve latch-up characteristics.

The examples also provide for the structure of a semiconductor device that adds a halo region to a drain to prevent punch through.

The examples also provide for the structure of a semiconductor device that abuts a source and a bulk to reduce the length of the semiconductor device and the size of a pitch. Such a structure is used because it is not necessary to have an isolation region between the source and the bulk-tap.

The examples also provide for the structure of a semiconductor device that includes additionally forming a well region and an LDD region in a source region, or alternatively forming a source region and a drain region in a well region to reduce a channel length, accordingly.

The examples also provide for the structure of a semiconductor device in which a distance of a poly edge to an N+/P+-type region ($L_d$) is added or extended, similar to a high voltage device, to increase a breakdown voltage of the device and to use the device at various operational voltages.

Subsequently, examples having various effects are described further with reference to FIGS. 1 to 14. FIGS. 1 to 14 are illustrated using an example N-type structure. In the example of a P-type structure, a mask is matched in reverse compared to the N-type structure, such that portions of examples are provided in a similar manner, but using the complementary, different type of dopant.

FIG. 1 is a drawing illustrating an example of a top view of an NMOS semiconductor device.

An example of an NMOS semiconductor device includes a P-type substrate region 15 disposed on a substrate 10, a first P-type well region 131 and a second P-type well region 132, a source region 151 disposed on the P-type substrate region 15, a drain region 152 disposed on the second P-type well region 132, and a gate electrode 120 disposed on the second P-type well region 132.

As illustrated in the example of FIG. 1, a portion of gate electrode 120 overlaps the second P-type well region. The remainder of the gate electrode 120 overlaps with the P-type substrate region 15. The source region 151 and second P-type well region 132 are disposed to be separate from each other. Also, the second P-type well region 132 is disposed to extend laterally to the source region 151 from the drain region 152, and is disposed above at least half of a length of the gate electrode 120. The second P-type well region 132 is disposed to overlap by 50 to 90% of the length of the gate electrode 120.

The NMOS semiconductor device further includes a first P-type bulk region 161 and a second P-type bulk region 162 that are disposed in the second P-type well region 132. The NMOS semiconductor device further includes a well contact plug 181 in contact with the first P-type bulk region 161, a source contact plug 182 in contact with the source region 151, a drain contact 183 in contact with the drain region 152, and a gate contact plug 184 in contact with the gate electrode 120. The NMOS semiconductor device further includes a first trench isolation 111 in contact with the source region 151 and a second trench isolation 112.

In the example of FIG. 1, the drain region 152 has an area that is the same as or similar to the area of source region 151. In terms of area, the drain region 152 and source region 151 have a symmetrical structure. For example, the P-type substrate region 15 has the same concentration as the substrate 10. The P-type substrate region 15 is a portion of the substrate 10. Thus, in such an example, the substrate 10 is P-type conductive.

Figure 2:
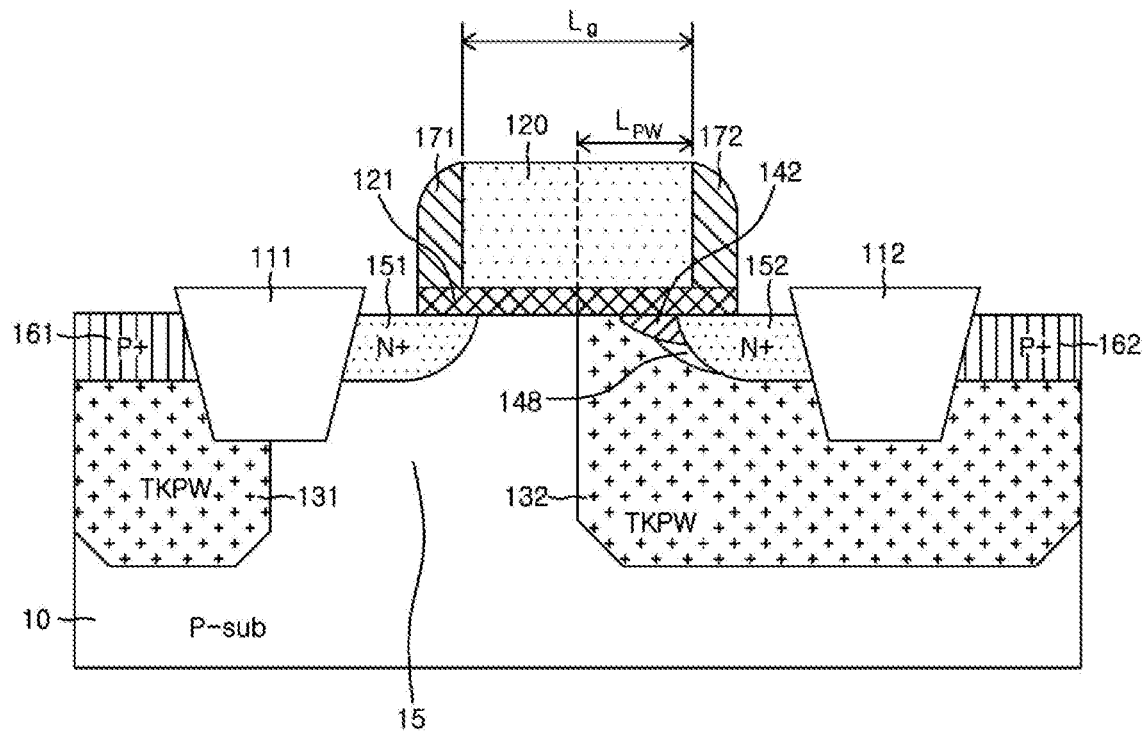
FIG. 2 is a cross sectional view of an example of the NMOS semiconductor device of FIG. 1 along line 2-2'.

FIG. 2 is a cross sectional view of the example of an NMOS semiconductor device of FIG. 1 along line 2-2'.

As illustrated in the example of FIG. 2, an example of an NMOS semiconductor device includes a first P-type well region 131 and second P-type well regions 132 that are disposed in the substrate 10. The first P-type well region 131 and second P-type well regions 132 are spaced apart from each other. Thus, there is a P-type substrate 10 disposed between the first P-type well region 131 and second P-type well region 132. An N-type source region 151 is disposed between the first P-type well region 131 and the second P-type well region 132. Also, an N-type LDD region 142 and drain region 152 are disposed in the second P-type well region 132. A gate insulating layer 121 and the gate electrode 120 are disposed on the second P-type well region 132. Each of a first spacer 171 and second spacer 172 is disposed on a side of the gate electrode 120. The gate electrode 120 partially overlaps the second P-type well region 132. The N-type source region 151 and the second P-type well region 132 are disposed separately from each other. The second P-type well region 132 is disposed laterally toward the N-type source region 151 from the drain region, and disposed above at least half of a length of the gate electrode 120. Furthermore, second P-type well region 132 is disposed to overlap by 50 to 90% of the length of the gate electrode 120. No LDD region is formed near the N-type source region 151.

The NMOS semiconductor device further includes a first P-type bulk region 161 disposed in the first P-type well region 131 and a second P-type bulk region 162 disposed in the second P-type well region 132. The NMOS semiconductor device further includes a halo region 148 disposed near the drain region 152.

In further detail, the gate insulating layer 121 and gate electrode 120 are disposed on the substrate 10. Each of the N-type source region 151 and drain region 152 is disposed near the gate electrode 120. An asymmetric LDD region, which is the N-type LDD region 142, is disposed to extend from the drain region 152. The second P-type well region 132, which is asymmetric with respect to the gate electrode, encloses the N-type drain region 152 and the asymmetric N-type LDD region 142. The source region 151 is in contact with a P-type substrate region 15, wherein the P-type substrate region 15 is the same as the substrate 10. In the example of FIG. 2, the second P-type well region 132 is disposed closer to the N-type drain region 152 than the source region 151.

As illustrated in the example of FIG. 2, a length of the gate electrode 120 corresponds to $L_g$. The length of the second P-type well region 132 overlapping with the gate electrode 120 corresponds to $L_{pw}$, that is, that is an overlapping length.

The overlapping rate is $L_{pw}/L_g*100$, referring to a percentage of the length of the second P-type well region 132 overlapping with the gate electrode against the length of the gate electrode 120. For example, the overlapping rate may retain a value in a range of 50 to 90%, but it the overlapping rate not limited to a specific rate. For example, when the overlapping rate is 50%, if the length of the gate electrode 120, that is, $L_g$, is 0.35 um, the overlapping length is 0.175 um, and if $L_g$ is 10 um, the overlapping length is 5 um, accordingly.

In such examples, an effective channel length decreases to half the length, so a threshold voltage $V_{th}$ decreases and a drain current $I_{dsat}$ increases. When an overlapping rate becomes lower, the size of a well-resistance becomes lower accordingly, so $R_{dson}$, referring to a specific ON resistance, decreases as well.

A factor that establishes a channel configuration and determines a threshold voltage $V_{th}$ is a concentration of a well. The less the overlapping value is, the smaller in size the second P-type well region 132 is, accordingly. Therefore, the less the overlap, as discussed above, the less the concentration of the second P-type well region 132 is. Thus, an effect of making the n+ drain region 152 larger is generated, as well. As a practical result, by following such an example, the effect of reducing an effective channel length is obtained.

As illustrated in the example of FIG. 2, the halo region 148 is formed near the n+ drain region 152 via a halo ion implantation process. The halo region 148 prevents a punch-through effect which may result from a reduced channel length that is less than a general transistor according to an alternative technology. Such a punch-through effect would be problematic because it otherwise would increase the output conductance and limit the maximum operating voltage of the semiconductor device.

Figure 3:
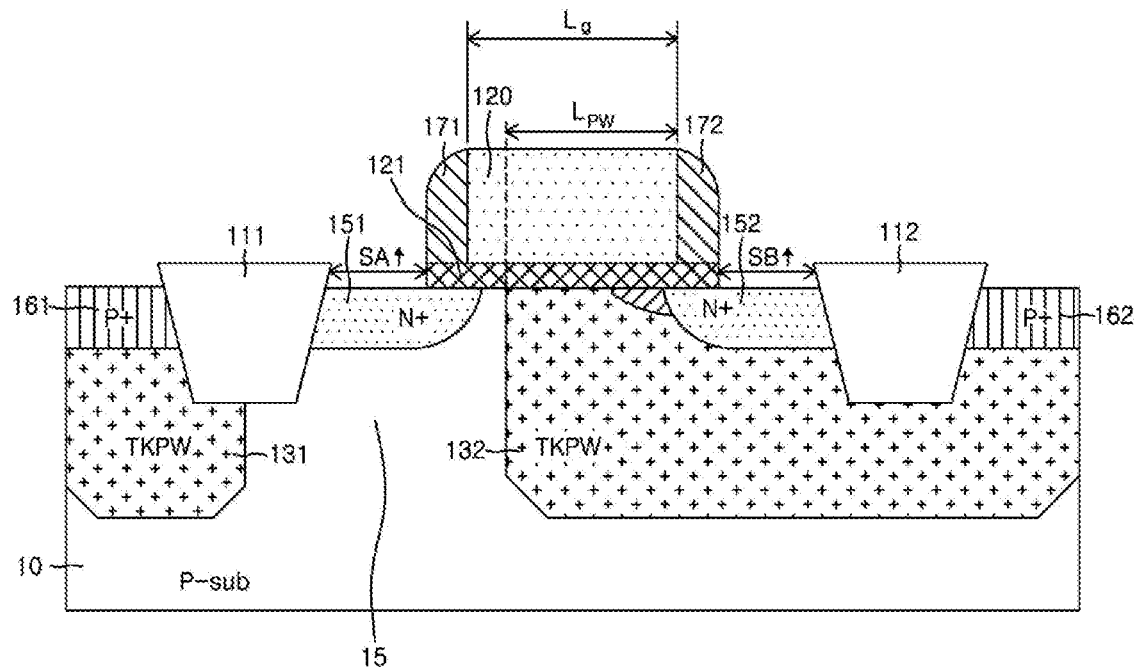
FIG. 3 is a cross sectional view of another example of the NMOS semiconductor device of FIG. 1 along line 2-2' in the same manner as FIG. 2.

FIG. 3 is a cross sectional view of another example of the NMOS semiconductor device of FIG. 1 along line 2-2' in the same manner as in FIG. 2.

FIG. 3 shows that lengths of a source region 151, drain region 152, and second P-type well region 132 overlapping with the gate electrode 120, corresponding to $L_{pw}$, may be adjusted. The length of the second P-type well region 132, corresponding to $L_{pw}$, is 90% of the length of the gate electrode 120, corresponding to $L_g$. Such a length spreads or extends to the source region 151. The greater the extent to which a part of second P-type well region 132 overlapping with the gate electrode 120 spreads, the greater an area of the second P-type well region 132 overlapping with the gate electrode 120 is in size. Accordingly, the larger an area of the second P-type well region 132 under the gate electrode is in size, the further drift resistance of electrodes increases. Thus, $I_{dsat}$ decreases. Because the second P-type well region 132 has a higher dopant concentration than that of P-type substrate 10, more energy is needed in order for electrons to move in the semiconductor device. By contrast, as an area of the second P-type well region 132 becomes smaller in size, $V_t$ decreases, $R_{dson}$ decreases, and $I_{dsat}$ increases accordingly, following a counterpart rationale to that presented above.

As illustrated in the example of FIG. 3, a source region 151 and a drain region 152 are simultaneously extended or either region is extended separately. Semiconductor device characteristics may vary depending on a length of source region 151 SA and a length of drain region 152 SB. SA and SB affect $V_{th}$, $I_{dsat}$, and so on, because a resistance value between the source region 151 and drain region 152 varies depending on the values assumed by SA and SB. Meanwhile, when a target value of electrical characteristics changes slightly, it is convenient to adjust SA and SB rather than adjusting ion implantation concentration to a target value corresponding to desired electrical characteristics. Adjusting SA and SB is preferable because adjusting ion implantation concentration may have side effects or affect the operation or structure of other devices or other parts of the semiconductor device. As illustrated in the example of FIG. 3, a length of the drain region 152 corresponds to SB. In such an example, SB starts from an edge of the second spacer 172 to an edge of the isolation region 112. That is, alternatively put, SB refers to a width or length from the edge of second spacer 172 to an edge of the drain region 152.

Figure 4:
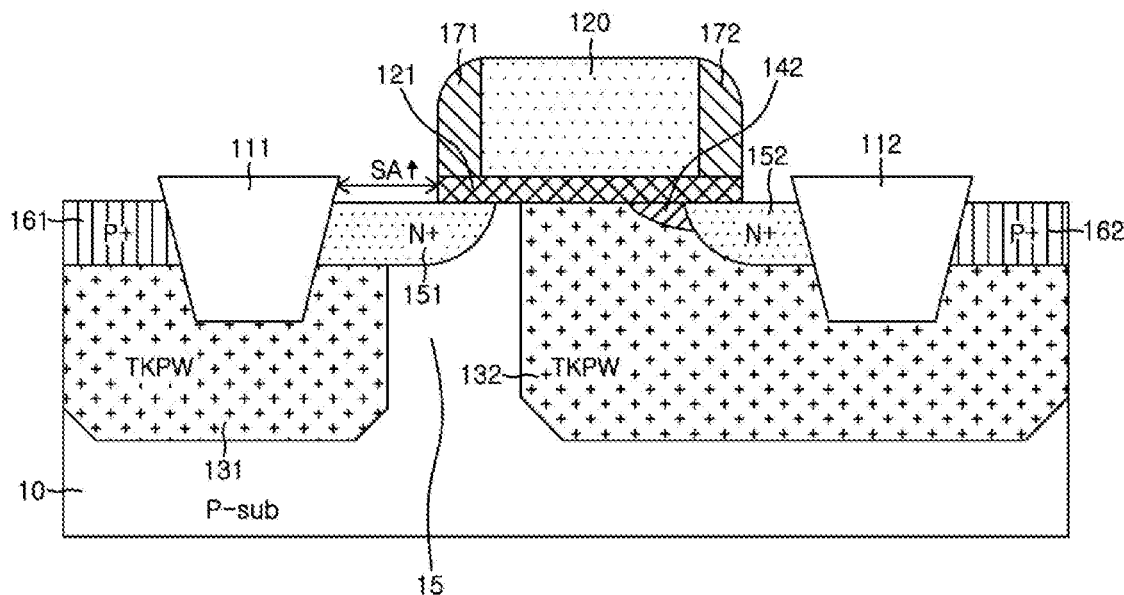
FIG. 4 is a cross sectional view of another example of an NMOS semiconductor device.

FIG. 4 is a cross sectional view of another example of an NMOS semiconductor device. This is another example of FIG. 1 along line 2-2', similar to the example of FIG. 2.

In the example of FIG. 4, a first P-type well region 131 overlaps with a source region 151. The first P-type well region 131 overlaps with the extended source region 151. In this example, the width of the first P-type well region 131 may be adjusted. A portion of the first P-type well region 131 overlaps with a bottom side of the source region 151. The overlapping length may be adjusted as well. As a consequence of adjusting the overlapping length, the first P-type well region is helpful to reduce latch-up characteristics of the semiconductor device. Latch-up characteristics are a type of short circuit which could disrupt proper functioning of the semiconductor device, and avoiding latch-up effects helps preserve the operational integrity of the semiconductor device.

Figure 5:
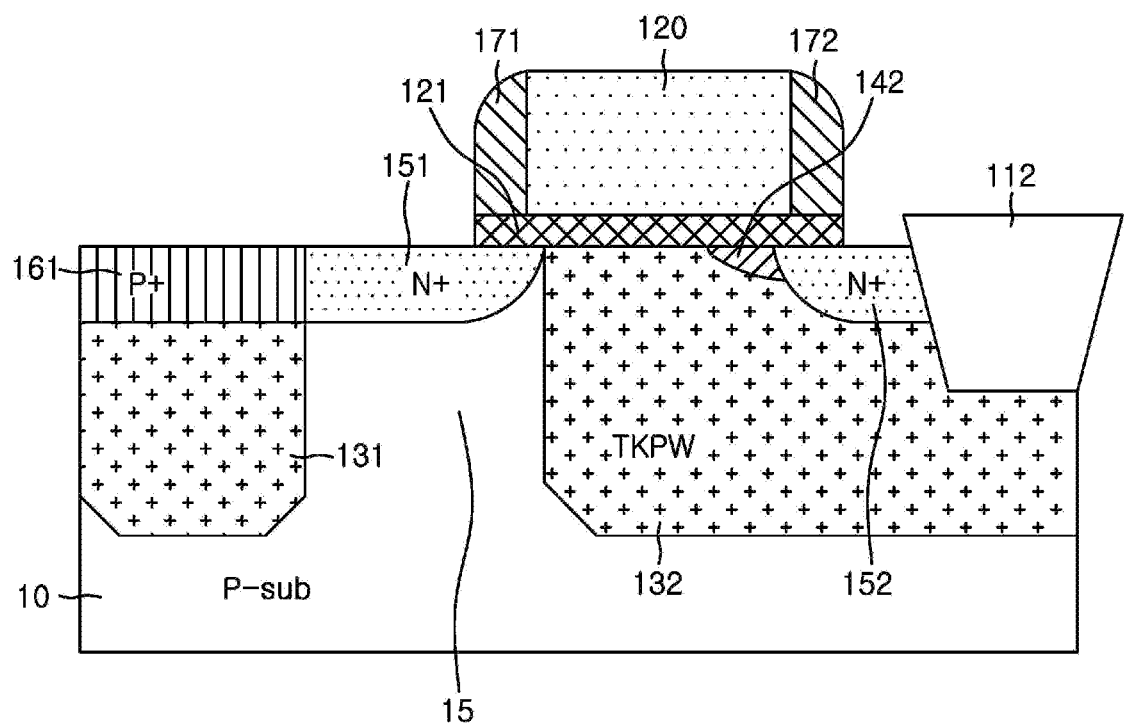
FIG. 5 is a cross sectional view of another example of an NMOS semiconductor device.

FIG. 5 is a cross sectional view of another example of an NMOS semiconductor device.

As illustrated in the example of FIG. 5, a first P-type bulk region 161 is disposed to be in contact with an N-type source region 151. That is, the first bulk region 161 and the source region 151 abut each other. In addition, the first bulk region 161 is disposed to be in the first P-type well region 131. A second trench isolation 112 is disposed to be in contact with a drain region 152 and is disposed in the second P-type well region 132. In such an example, any isolation region between the source region 151 and a bulk-tap is not required, so a length is reduced accordingly. Further, in this kind of structure, a pitch size of semiconductor device is reduced, so it is advantageous with respect to allowing the chip size requirements to be reduced.

Figure 6:
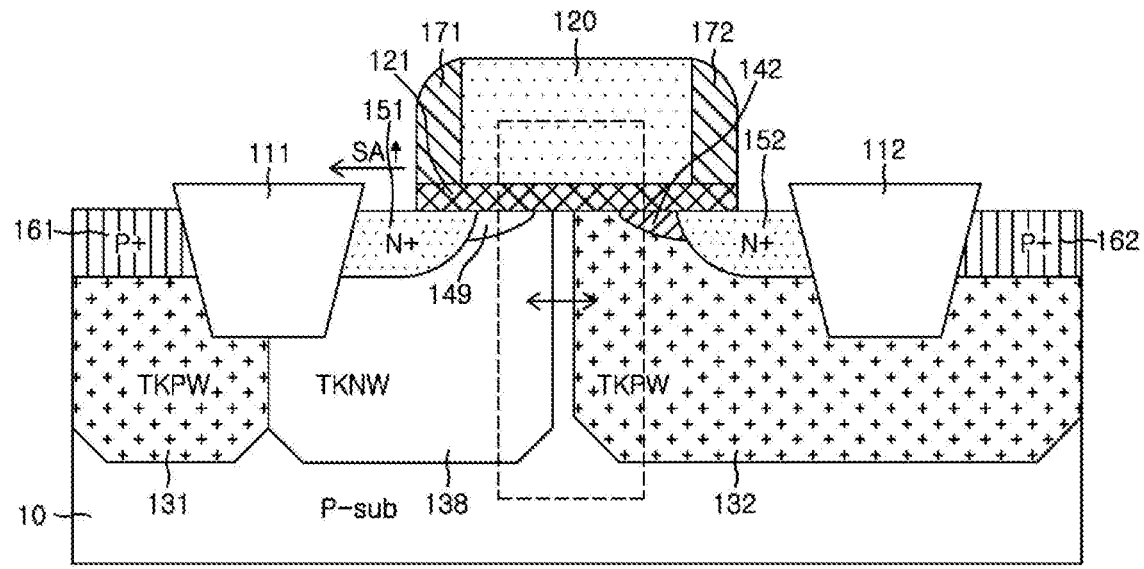
FIG. 6 is a cross sectional view of another example of an NMOS semiconductor device.

FIG. 6 is a cross sectional view of another example of an NMOS semiconductor device.

As illustrated in the example of FIG. 6, a semiconductor device further includes an N-type well region 138 and a P-type LDD region 149. In the example of FIG. 6, the N-type well region 138 is disposed between a first P-type well region 131 and a second P-type well region 132. Also, in such an example, the P-type LDD region 149 is disposed in the N-type well region 138. The N-type well region 138 may generate an effect of reducing a channel length. Such a region is a region in which a P-type well region is otherwise supposed to be disposed, but an N-type well region is disposed instead. Constructing the semiconductor in such a manner makes it possible to turn on the semiconductor device more quickly. As a result, in such an example, an effect of reducing a channel length occurs. For example, the P-type LDD region 149 in such an example is disposed by injecting boron (B+) ion dopants.

However, when applying an N-type well region without forming the P-type LDD region 149 as in alternative technologies, punch-through may occur, as discussed further, above. For that reason, the P-type LDD region 149 is disposed when placing an N-type well region. In the example of an NMOS semiconductor device, the N-type well region 138 and P-type LDD region 149 are both disposed. In contrast, in the case of a PMOS semiconductor device, the P-type well region and N-type LDD region are disposed, which reverses the dopant types in a corresponding manner. Accordingly, the N-type well region 138 is disposed as spaced apart from a second P-type well region 132.

Because a drive-in-annealing process is not executed in a low cost process, the N-type well region 138 is disposed as being spaced from apart from the second P-type well region 132. However, in a scenario that a heat process is added, the N-type well region 138 is disposed to contact the second P-type well region 132, leading to possible dopant diffusion. Since examples of the present disclosure are directed to describing structures of low-cost semiconductors, the N-type well region 138 is disposed spaced apart from the second P-type well region 132. The P-type LDD region 149 is disposed to extend from the source region 151. The N-type well region 138 encloses the N-type source region 151 and P-type LDD region 149. In such an example, the P-type LDD region 149 is disposed to contact the source region 151.

Figure 7:
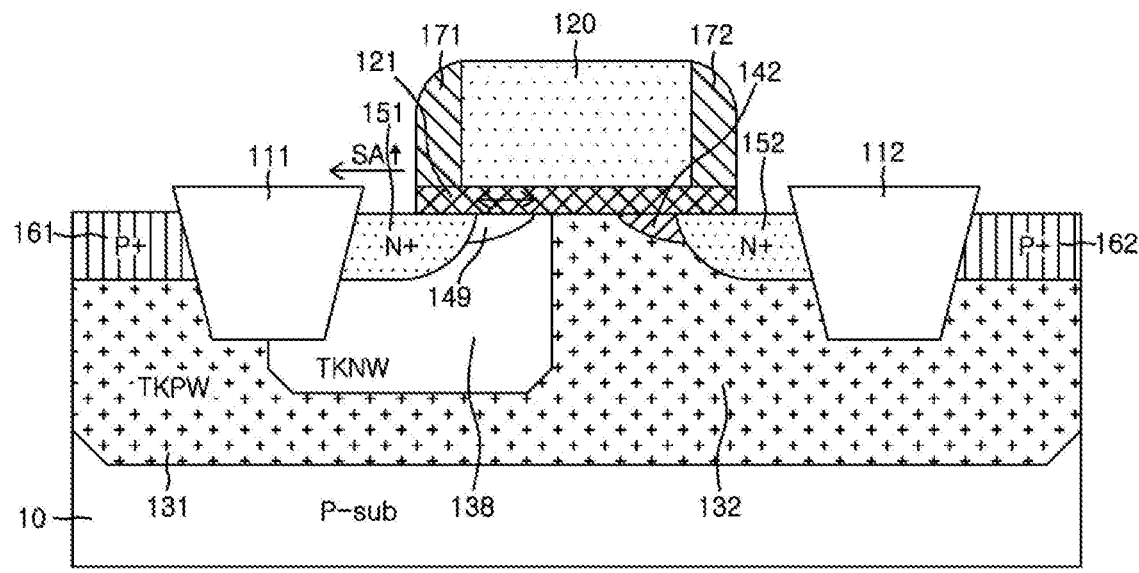
FIG. 7 is a cross sectional view of another example of an NMOS semiconductor device.

FIG. 7 is a cross sectional view of another example of an NMOS semiconductor device.

FIG. 7 illustrates an example of a semiconductor device in which an N-type well region 138 is enclosed fully by first and second P-type well regions 131, 132, differing from what is shown in the example of FIG. 6. The first P-type well region 131 is disposed in a substrate 10 and also below a source region 151. The second P-type well region 132 is disposed in the substrate 10 and encompasses a drain region 152. The first P-type well region 131 is in contact with the second P-type well region 132. The first P-type well region 131 and the second P-type well region 132 are disposed below the N-type well region 138. In the example of FIG. 7, the N-type source region 151 and the P-type LDD region 149 are disposed in the N-type well region 138. Also, in such an example, a gate insulating layer 121 and a gate electrode 120 are disposed on the second P-type well region 132 and the N-type well region 138.

Figure 8:
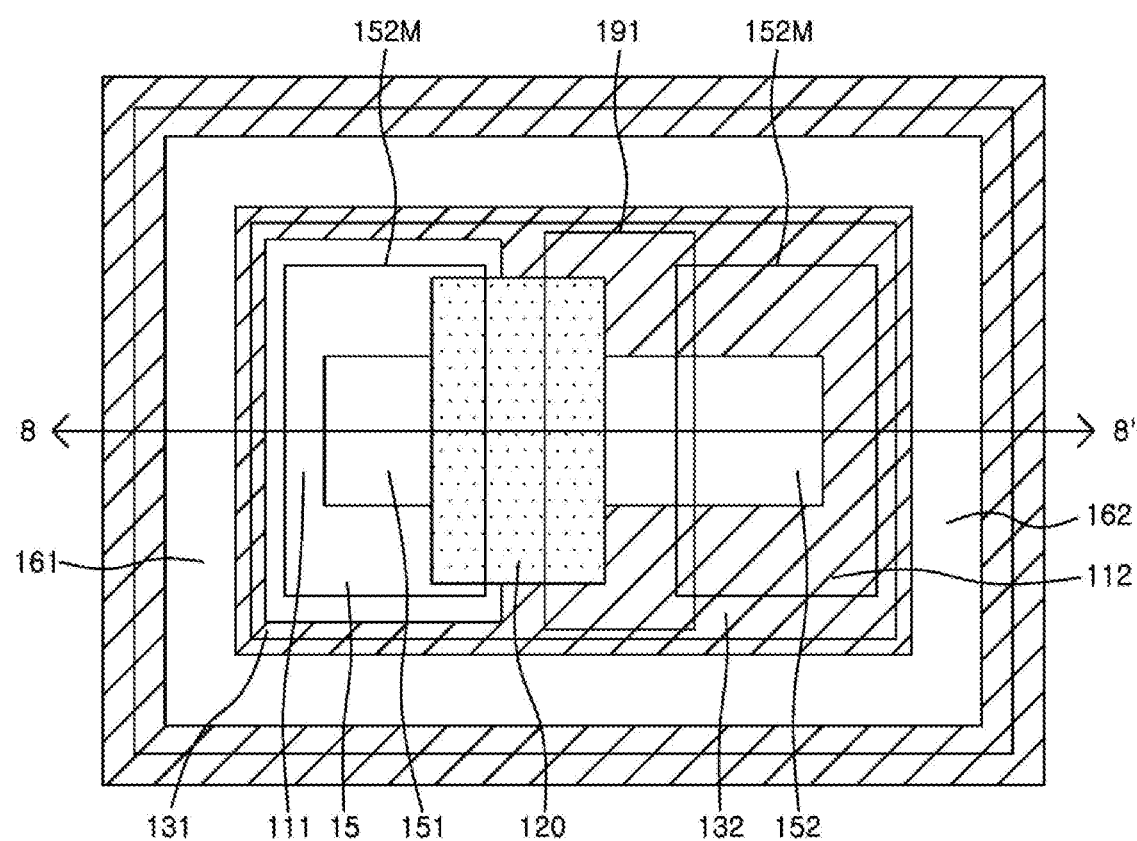
FIG. 8 is a drawing illustrating a top view of an NMOS semiconductor device according to another example.

FIG. 8 is a drawing illustrating a plan view of an NMOS semiconductor device according to another example.

By contrast to the example of FIG. 1, the structure of an example illustrated in the example of FIG. 8 is directed to an example in which an area of a drain region 152 is larger than an area of a source region 151, and the drain region 152 and the source region 151 are asymmetric. This kind of asymmetric structure is intended for use in medium-voltage devices rather than low-voltage devices. For example, such an asymmetric structure is potentially used for various products and techniques in which a drain voltage is 4 to 20 V or has other ranges.

In the example of FIG. 8, an NMOS semiconductor device includes a first P-type well region 131 and a second P-type well region 132 disposed in a substrate 10. Furthermore, in the example of FIG. 8, the source region 151 is disposed in the substrate 10, the drain region 152 is disposed in the second P-type well region 132, and a gate electrode 120 is disposed on the second P-type well region 132. For example, as illustrated in the example of FIG. 8, a portion of gate electrode 120 overlaps with the second P-type well region 132. The remainder of gate electrode 120 overlaps with a P-type substrate region 15. The source region 151 and second P-type well region 132 are disposed to be spaced apart from each other. The second P-type well region 132 is disposed to extend laterally toward the source region 151 from the drain region in excess of a portion corresponding to half of the gate electrode 120. The second P-type well region 132 is disposed to overlap with the gate electrode 120 by 50 to 90% of the length of the gate electrode 120. The NMOS semiconductor device further includes a first P-type bulk region 161 and a second P-type bulk region 162 that are disposed in the first and second P-type well regions 131, 132, respectively. The NMOS semiconductor device further includes a first trench isolation 111 disposed to be in contact with the source region 151 and a second trench isolation 112 disposed to be in contact with the second P-type well region 132.

As illustrated in the example of FIG. 8, the NMOS semiconductor device further includes a silicide blocking mask 191, which is intended for preventing the formation of a silicide. Such prevention occurs in order to increase a resistance between the drain region 152 and gate electrode 120. In consequence of preventing such a formation of a silicide, a breakdown voltage between the source and the drain of the NMOS semiconductor increases in such an example.

As illustrated in the example of FIG. 8, an n+source-drain mask 152M is disposed in order to facilitate the formation of the source region 151 and drain region 152, as discussed above.

Figure 9:
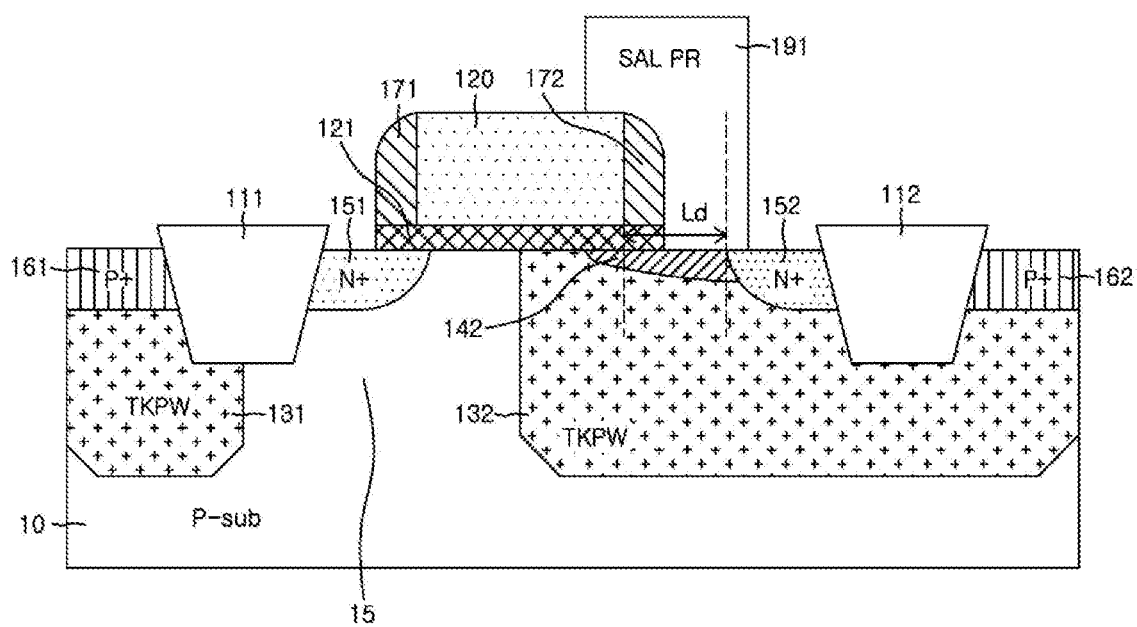
FIG. 9 is a cross sectional view of an example of the semiconductor device of FIG. 8 along line 8-8'.

FIG. 9 is a cross sectional view of an example of a semiconductor device of the example of FIG. 8 along line 8-8'. As illustrated in the example of FIG. 9, the silicide blocking mask 191 is disposed between the drain region 152 and gate electrode 120, in order to increase a breakdown voltage between the source and drain. The silicide blocking mask 191 deposits a portion of the gate electrode 120, so silicide is not formed on a portion of the gate electrode 120 nor is silicide formed on a surface of an N-type LDD region 142. In the drain region 152 in which the silicide blocking mask 191 is not disposed, cobalt silicide, nickel silicide, and titanium silicide are formed due to the lack of the silicide blocking mask 191 in these areas. Accordingly, the silicide blocking mask 191 is formed after deposition of a silicide blocking material. Thus, patterning silicide blocking material is performing using the silicide blocking mask 191 as a mask. The result of such patterning is illustrated in FIG. 10.

Figure 10:
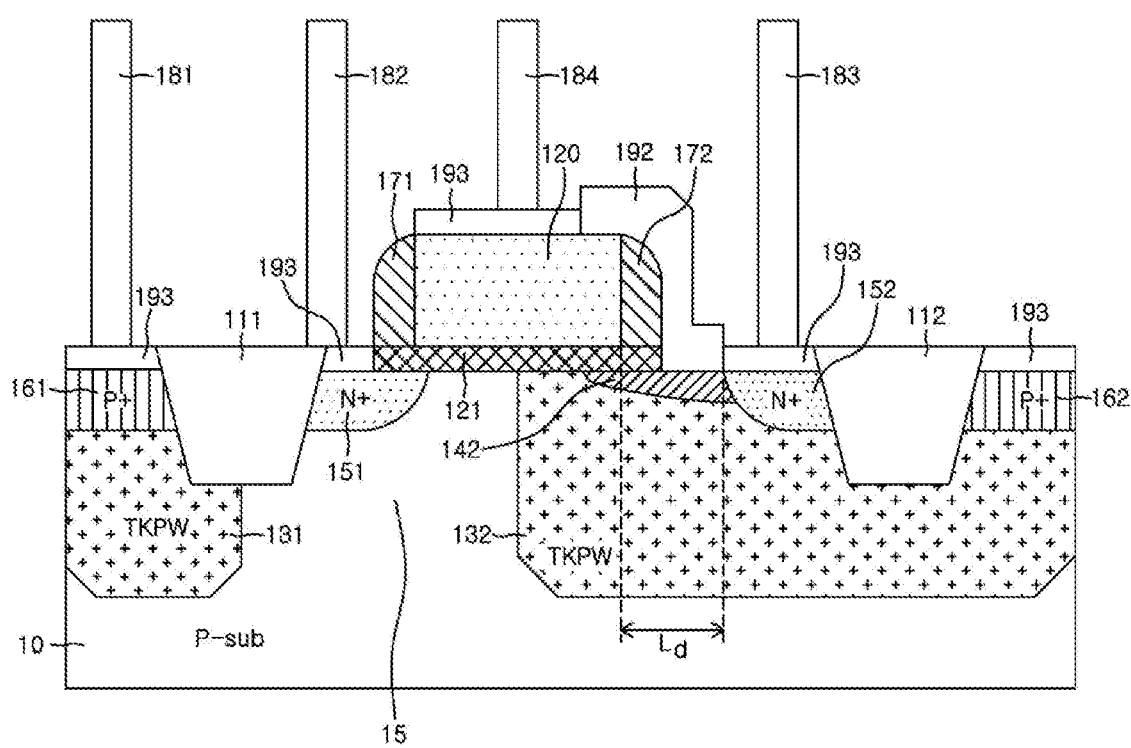
FIG. 10 is a cross sectional view of another example of an NMOS semiconductor device after patterning of a silicide blocking material.

FIG. 10 is a cross sectional view of another example of an NMOS semiconductor device after patterning silicide blocking material.

As illustrated in the example of FIG. 10, a drain region 152 does not overlap with a gate electrode 120 and is disposed spaced apart from the gate electrode 120. In the NMOS semiconductor device, a silicide blocking insulating layer 192 is deposited to cover a second spacer 172 and an N-type LDD region 142. The silicide blocking insulating layer 192 is disposed to extend continuously from a portion of the gate electrode 120 to a portion of the substrate 10 disposed between the gate electrode 120 and the drain region 152. Thus, the silicide blocking insulating layer 192 is disposed to extend to a portion, that is, a first region, of the gate electrode 120. A silicide 193 is formed in the remaining portion, that is, a second region, of the gate electrode 120. Under the silicide blocking mask 191, there is present a silicide blocking insulating layer. In an area in which the silicide blocking mask 191 is not disposed, a silicide is disposed accordingly. The NMOS semiconductor device further includes a well contact plug 181 in contact with a first P-type well region 131, a source contact plug 182 in contact with a source region 151, a drain contact plug 183 in contact with a drain region 152, and a gate contact plug 184 in contact with the gate electrode 120. In the example of FIG. 10, first and second spacers 171, 172 are disposed on side walls of the gate electrode 120.

The drain region 152 has a value of $L_d$ as if it were a high-voltage device. In the example of FIG. 10, $L_d$ refers to a distance from an edge of gate electrode 120 to the drain region 152. This choice of structure leads to an increase in a Breakdown Voltage Drain-Source Substrate (BVDSS) of an asymmetric Large Angle of Tilt (LAT) device and the area of an operating voltage $V_{op}$ applicable to the drain region 152. For example, this structural approach is used for various products and techniques in which a drain voltage is 5 to 7 V or having other appropriate ranges.

Figure 11:
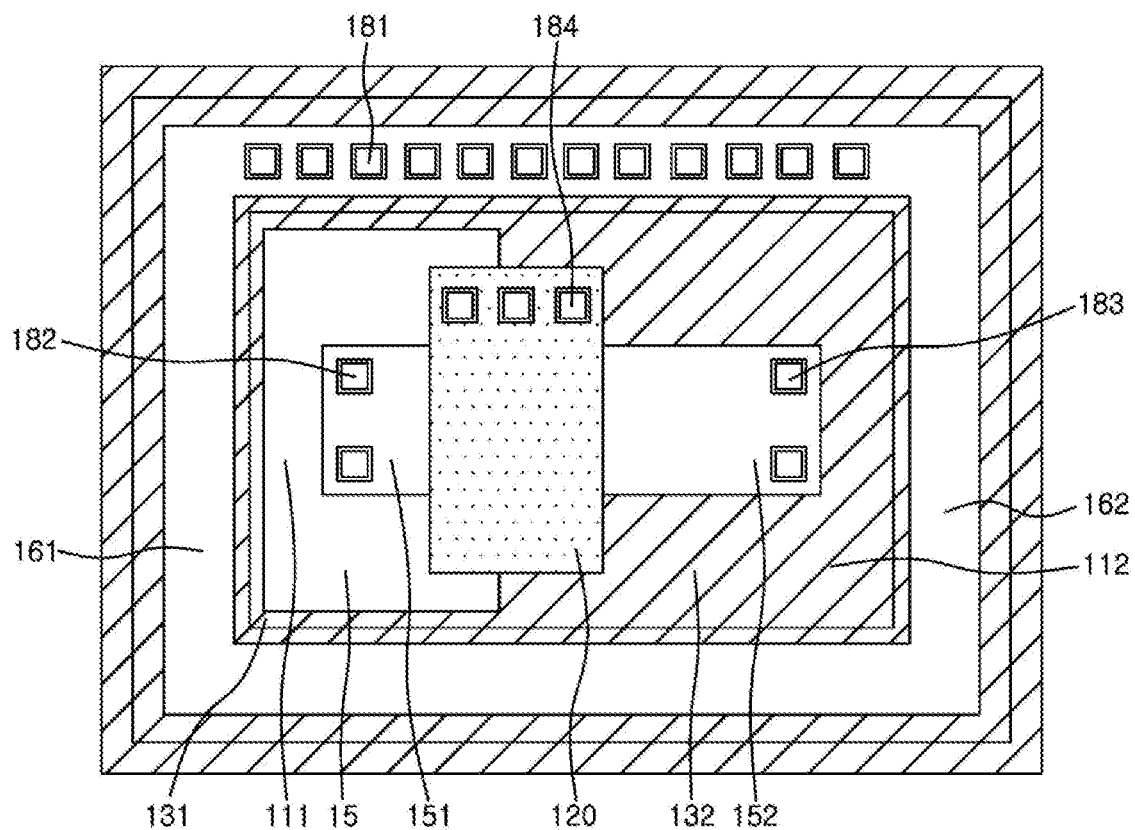
FIG. 11 is a diagram illustrating an example of an NMOS semiconductor device having a contact plug.

FIG. 11 is a diagram illustrating an example of an NMOS semiconductor device having a contact plug.

The example of FIG. 11 is similar to the example of FIG. 8 except for that a contact plug is additionally illustrated in the example of FIG. 11. The NMOS semiconductor device of the example of FIG. 11 further includes a well contact plug 181 in contact with the first P-type well region 131, a source contact plug 182 in contact with the source region 151, a drain contact 183 in contact with the drain region 152, and a gate contact plug 184 in contact with the gate electrode 120. The description of the other parts of the example of FIG. 11 is similar to that of the corresponding other parts of FIG. 8 and is omitted for brevity.

Figure 12:
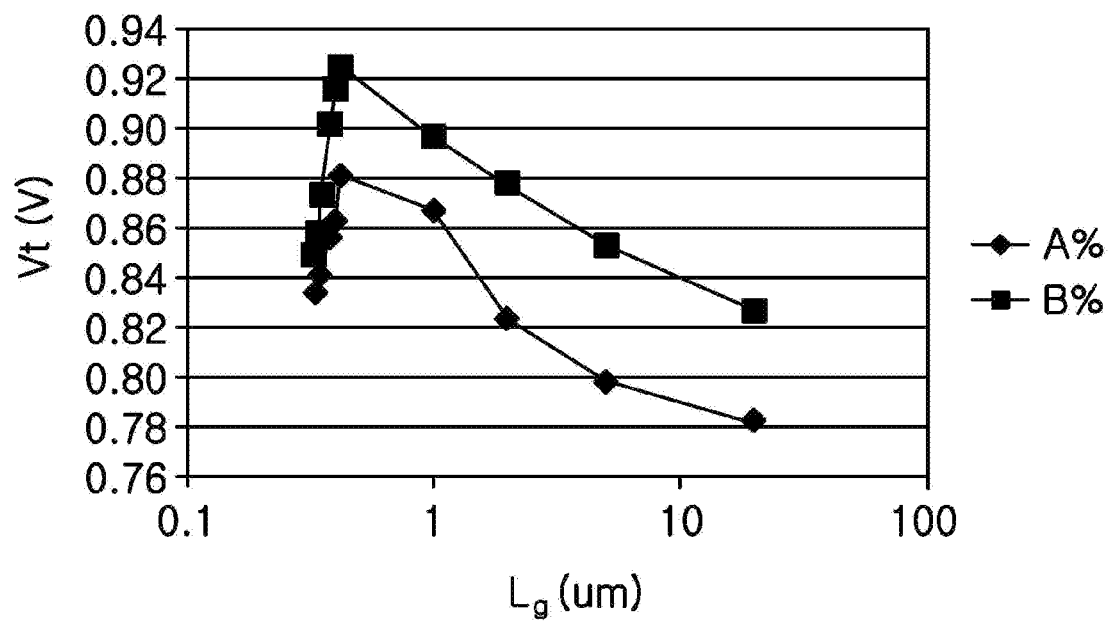
FIGS. 12 to 14 are electrical characteristics of a semiconductor device.
Figure 13:
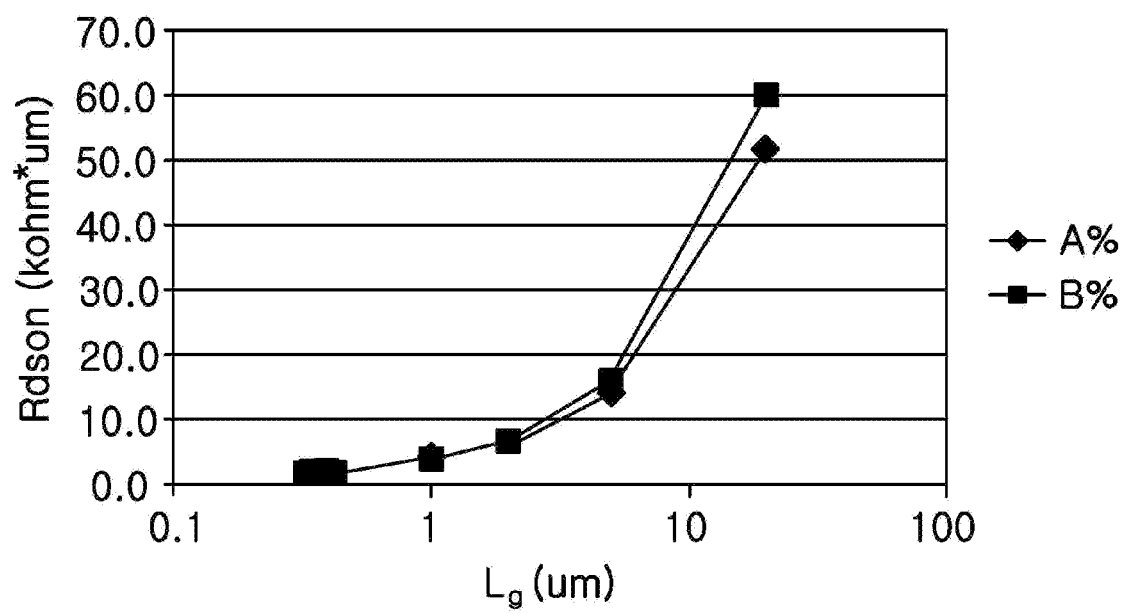
Figure 14:
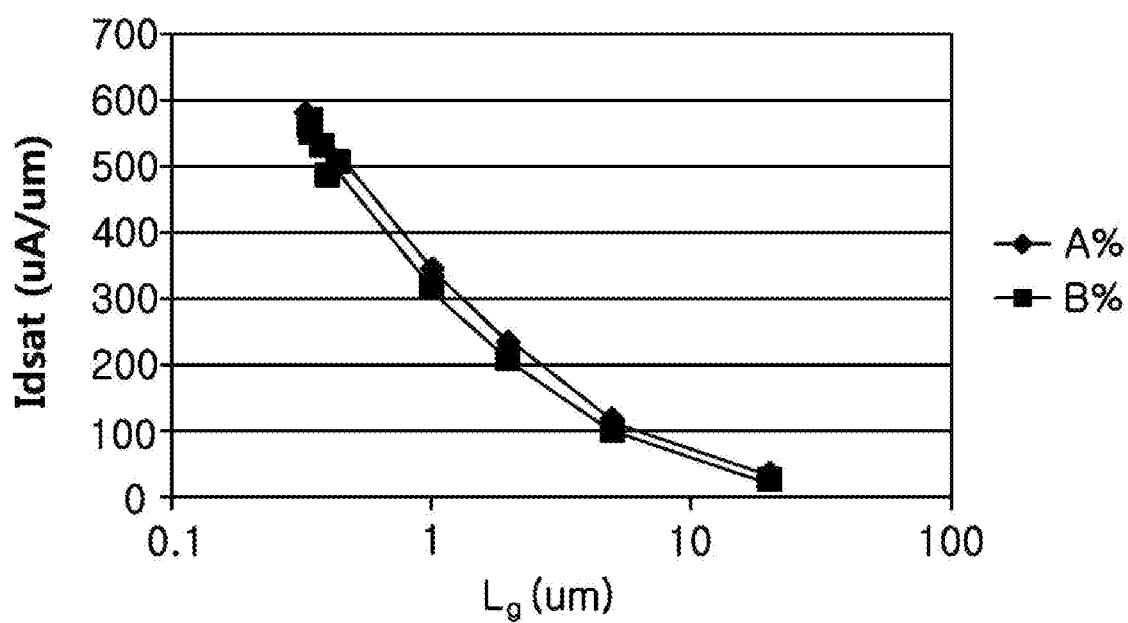

FIGS. 12 to 14 are graphs comparing characteristics of a semiconductor device when an overlapping ratio of $L_{pw}$ to $L_g$ is 50% (A) and 90% (B).

A result of comparing characteristics of a semiconductor device in which an overlapping ratio of $L_{pw}$ to $L_g$, calculated as ($L_{pw}/L_g$*100), is 50% and 90% is illustrated in FIGS. 12 to 14. Referring to the result in FIGS. 12 to 14, a linear threshold voltage $V_{t,lin}$, $R_{dson}$, and a drain current $I_{dsat}$ of a semiconductor device change depending on the overlapping ratio. As the overlapping ratio becomes lower, the $V_{t,lin}$ and Rdson decrease, but $I_{dsa}$ increases.

The present examples are accordingly able to reduce $R_{dson}$ by using an asymmetric LDD structure and a well structure.

In addition, the present examples provide a way to manufacture a semiconductor device at a relatively low cost by forming a well region and an LDD region based on the same asymmetric mask pattern after a gate manufacturing process, which provides the ability to reduce the number of masks used in the semiconductor device.

According to the examples of the present disclosure, two out of the masks otherwise required for manufacture of a semiconductor device are not required, so an ion implantation process required in an alternative art is able to be omitted. Therefore, a manufacturing cost for the semiconductor device is accordingly reduced.

The present examples reduce an effective channel length and a threshold voltage by adjusting a well region or a source-drain region and improve latch-up characteristics by increasing a well concentration under the source-drain region.

The present examples prevent punch through by adding a halo region to a drain.

The present examples reduce the length of a semiconductor device and the size of a pitch by abutting a source and a bulk, and therefore do not need to have an isolation region between a source and a bulk-tap.

The present examples reduce a channel length by forming a well region and an LDD region in a source region additionally, or forming a source region and a drain region in a well region.

Thus, the examples presented above disclose a multi-chip package of power semiconductor that increases the reliability of products by reducing the inductance and resistance of a wire or clip by bonding a gate electrode, a source electrode, and a drain electrode.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
    a substrate;
    a first P-type well region and a second P-type well region disposed in the substrate, wherein the first P-type well region and the second P-type well region are spaced apart from each other;
    an N-type source region disposed in the substrate, wherein the N-type source region is disposed spaced apart from the second P-type well region;
    an N-type drain region disposed in the second P-type well region;
    an N-type LDD region disposed near the N-type drain region; and
    a gate insulating layer and a gate electrode disposed on the substrate,
    wherein the gate electrode partially overlaps the second P-type well region.

2. The semiconductor device of claim 1, further comprising:
    an isolation region disposed between the first P-type well region and the N-type source region,
    wherein the first P-type well region is in contact with the isolation region.

3. The semiconductor device of claim 1, wherein the second P-type well region extends laterally toward the N-type source region from the N-type drain region, and is disposed above at least half of a length of the gate electrode.

4. The semiconductor device of claim 1, wherein the second P-type well region is disposed to overlap from 50 to 90% of an entire length of the gate electrode.

5. The semiconductor device of claim 1, wherein no LDD region is disposed near the N-type source region.

6. The semiconductor device of claim 1, wherein the first P-type well region vertically overlaps the N-type source region.

7. The semiconductor device of claim 1, further comprising a halo region disposed near the N-type drain region.

8. The semiconductor device of claim 1, further comprising:
    a first P-type bulk region disposed in the first P-type well region; and
    a second P-type bulk region disposed in the second P-type well region.

9. The semiconductor device of claim 8,
wherein the semiconductor device comprises a well contact plug, a source contact plug, a drain contact plug, or a gate contact plug, or
wherein the semiconductor device comprises any combination of the well contact plug, the source contact plug, the drain contact plug, and the gate contact plug, and
wherein the well contact plug is in contact with the first P-type bulk region, the source contact plug is in contact with the type source region, the drain contact plug is in contact with the N-type drain region, and the gate contact plug is in contact with the gate electrode.

10. The semiconductor device of claim 1, further comprising a first trench isolation in contact with the N-type source region and a second trench isolation in contact with the N-type drain region.

11. The semiconductor device of claim 1, wherein the N-type drain region has an area that is the same as or similar to the area of the N-type source region.

12. The semiconductor device of claim 1,
wherein the N-type source region is disposed spaced apart from the first P-type well region.

13. A semiconductor device, comprising:
a substrate;
a first well region and a second well region disposed in the substrate, wherein the first well region and the second well region are spaced apart from each other;
a source region disposed in the substrate, wherein the source region is disposed spaced apart from the second well region;
a drain region disposed in the second well region;
an LDD region disposed near the drain region; and
a gate insulating layer and a gate electrode disposed on the substrate,
wherein the gate electrode partially overlaps the drain region having a same conductivity type as the LDD region.

14. The semiconductor device of claim 13, wherein the LDD region having a first conductivity type is disposed in the second well region having a second conductivity type different from the first conductivity type.

15. The semiconductor device of claim 13, wherein the first well region has a same conductivity type as the second well region.

16. A semiconductor device, comprising:
a substrate;
a first well region and a second well region disposed in the substrate, wherein the first well region and the second well region are spaced apart from each other and have a same conductivity type as each other;
a source region disposed in the substrate, wherein the source region is disposed spaced apart from the second well region;
a drain region disposed in the second well region;
an LDD region disposed near the drain region; and
a gate insulating layer and a gate electrode disposed on the substrate,
wherein the gate electrode overlaps the second well region.

17. The semiconductor device of claim 16, wherein the LDD region having a first conductivity type is disposed in the second well region having a second conductivity type different from the first conductivity type.

18. The semiconductor device of claim 16, wherein the source region is disposed spaced apart from the first well region.

19. The semiconductor device of claim 16, wherein the LDD region has a depth smaller than a depth of the drain region and has a same conductivity type as the drain region.

20. The semiconductor device of claim 16, wherein the second well region extends laterally from the drain region to the source region at least half of a gate electrode length.

* * * * *